United States Patent
Li et al.

(10) Patent No.: US 10,276,096 B2
(45) Date of Patent: Apr. 30, 2019

(54) ORGANIC LIGHT-EMITTING DISPLAY PANEL AND DRIVING METHOD THEREOF, AND ORGANIC LIGHT-EMITTING DISPLAY DEVICE

(71) Applicant: SHANGHAI TIANMA AM-OLED CO., LTD., Shanghai (CN)

(72) Inventors: Yue Li, Shanghai (CN); Gang Liu, Shanghai (CN); Huijun Jin, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/715,102

(22) Filed: Sep. 25, 2017

(65) Prior Publication Data

US 2018/0012547 A1   Jan. 11, 2018

(30) Foreign Application Priority Data

May 15, 2017   (CN) .......................... 2017 1 0337907

(51) Int. Cl.
  *G09G 3/20* (2006.01)
  *G09G 3/3233* (2016.01)
  (Continued)

(52) U.S. Cl.
  CPC ......... *G09G 3/3233* (2013.01); *G09G 3/2003* (2013.01); *G09G 3/3258* (2013.01);
  (Continued)

(58) Field of Classification Search
  CPC ..... G09G 2300/0426; G09G 2300/043; G09G 2300/0452; G09G 2310/0251;
  (Continued)

(56) References Cited

U.S. PATENT DOCUMENTS 7,742,653 B2 *   6/2010   Imai ........................ G06T 5/007
                                                       382/264
8,780,029 B2 *   7/2014   Nakamura ........... G09G 3/3655
                                                       345/204
(Continued)

FOREIGN PATENT DOCUMENTS

CN   101958098 A   1/2011
CN   104252836 A   12/2014
(Continued)

*Primary Examiner* — Michael J Jansen, II
(74) *Attorney, Agent, or Firm* — Kilpatrick Townsend & Stockton LLP

(57) ABSTRACT

The present application discloses an organic light-emitting display panel and a driving method thereof, as well as an organic light-emitting display device. The display panel includes: an array arrangement including pixel units, wherein each pixel unit comprises a first, a second, a third and a fourth subpixels; a pixel circuit is formed in each subpixel; the first, second, third and fourth subpixels of an identical pixel unit are arranged along a column direction and are electrically connected with a given reference signal line; a color of the first subpixel, a color of the second subpixel, a color of the third subpixel and a color of the fourth subpixel differ from one another, and the color of the first subpixel, the color the second subpixel and the color the third subpixel are red, blue and green, respectively; and the color of the fourth subpixel is not white.

12 Claims, 7 Drawing Sheets

(51) Int. Cl.
*G09G 3/3258* (2016.01)
*G09G 3/3266* (2016.01)
*G09G 3/3291* (2016.01)
*H01L 27/32* (2006.01)
*G06F 3/041* (2006.01)

(52) U.S. Cl.
CPC ......... *G09G 3/3266* (2013.01); *G09G 3/3291* (2013.01); *H01L 27/323* (2013.01); *H01L 27/3213* (2013.01); *H01L 27/3276* (2013.01); *G06F 3/041* (2013.01); *G06F 3/0412* (2013.01); *G09G 2300/043* (2013.01); *G09G 2300/0426* (2013.01); *G09G 2300/0452* (2013.01); *G09G 2310/0262* (2013.01); *G09G 2310/08* (2013.01); *G09G 2320/0233* (2013.01); *G09G 2320/0242* (2013.01); *G09G 2320/0295* (2013.01); *G09G 2320/045* (2013.01); *G09G 2320/064* (2013.01); *H01L 27/322* (2013.01)

(58) Field of Classification Search
CPC ....... G09G 2310/0262; G09G 2310/08; G09G 2320/0233; G09G 2320/0242; G09G 2320/0295; G09G 2320/045; G09G 2320/064; G09G 2330/023; G09G 3/2003; G09G 3/3233; G09G 3/3258; G09G 3/3266; G09G 3/3291
See application file for complete search history.

(56) References Cited

U.S. PATENT DOCUMENTS

| | | | | |
|---|---|---|---|---|
| 9,035,976 B2* | 5/2015 | Lee | | G09G 3/3283 |
| | | | | 345/691 |
| 9,122,339 B2* | 9/2015 | Yang | | G06F 3/0412 |
| 9,595,223 B2* | 3/2017 | Yang | | G09G 3/3233 |
| 9,646,533 B2* | 5/2017 | Hong | | G09G 3/3233 |
| 9,715,853 B2* | 7/2017 | Kim | | G09G 3/3266 |
| 9,818,046 B2* | 11/2017 | Kim | | H04N 5/202 |
| 9,928,776 B2* | 3/2018 | Kim | | G09G 3/3233 |
| 9,990,888 B2* | 6/2018 | Oh | | G09G 3/12 |
| 10,032,414 B2* | 7/2018 | Kim | | G09G 3/3258 |
| 10,068,520 B2* | 9/2018 | Xiang | | G09G 3/3208 |
| 10,170,044 B2* | 1/2019 | Park | | G09G 3/325 |
| 10,204,974 B2* | 2/2019 | Wang | | H01L 27/3276 |
| 2007/0071355 A1* | 3/2007 | Imai | | G06T 5/007 |
| | | | | 382/266 |
| 2011/0210911 A1* | 9/2011 | Nakamura | | G09G 3/3655 |
| | | | | 345/88 |
| 2013/0176498 A1* | 7/2013 | Noutoshi | | H04N 9/68 |
| | | | | 348/712 |
| 2013/0271356 A1* | 10/2013 | Yoshida | | H04N 9/67 |
| | | | | 345/88 |
| 2014/0022289 A1* | 1/2014 | Lee | | G09G 3/3283 |
| | | | | 345/691 |
| 2014/0152191 A1* | 6/2014 | Yang | | G09G 3/3233 |
| | | | | 315/240 |
| 2014/0168127 A1* | 6/2014 | Yang | | G06F 3/0412 |
| | | | | 345/173 |
| 2015/0084029 A1* | 3/2015 | Yamazaki | | G09G 3/20 |
| | | | | 257/40 |
| 2015/0170565 A1* | 6/2015 | Hong | | G09G 3/3233 |
| | | | | 345/212 |
| 2016/0125622 A1* | 5/2016 | Kim | | H04N 5/202 |
| | | | | 345/690 |
| 2017/0004776 A1* | 1/2017 | Park | | G09G 3/3233 |
| 2017/0039952 A1* | 2/2017 | Kim | | G09G 3/3233 |
| 2017/0061865 A1* | 3/2017 | Park | | G09G 3/325 |
| 2017/0122502 A1* | 5/2017 | Cok | | G09G 3/32 |
| 2017/0132977 A1* | 5/2017 | Kim | | G09G 3/3225 |
| 2017/0132979 A1* | 5/2017 | Oh | | G09G 3/12 |
| 2017/0193901 A1* | 7/2017 | Wang | | G09G 3/3233 |
| 2017/0294166 A1* | 10/2017 | Kim | | G09G 3/3266 |
| 2017/0301286 A1* | 10/2017 | Xiang | | G09G 3/3208 |
| 2018/0012546 A1* | 1/2018 | Li | | G09G 3/3233 |
| 2018/0061296 A1* | 3/2018 | Shim | | G09G 3/006 |
| 2018/0083078 A1* | 3/2018 | Park | | H01L 27/3248 |
| 2018/0151126 A1* | 5/2018 | Jeong | | H01L 27/3276 |
| 2018/0151636 A1* | 5/2018 | Park | | H01L 27/3276 |
| 2018/0212183 A1* | 7/2018 | Ma | | H01L 51/5203 |

FOREIGN PATENT DOCUMENTS

| | | |
|---|---|---|
| CN | 105096820 A | 11/2015 |
| CN | 105761678 A | 7/2016 |
| KR | 20170026929 A | 3/2017 |

* cited by examiner

ORGANIC LIGHT-EMITTING DISPLAY PANEL AND DRIVING METHOD THEREOF, AND ORGANIC LIGHT-EMITTING DISPLAY DEVICE

CROSS-REFERENCE TO RELATED APPLICATION

This application is related to and claims priority from Chinese Patent Application No. 201710337907.0, filed on May 15, 2017, entitled "Organic Light-Emitting Display Panel and Driving Method thereof, and Organic Light-Emitting Display Device," the entire disclosure of which is hereby incorporated by reference for all purposes.

TECHNICAL FIELD

The present application relates to the technical field of display, and specifically to an organic light-emitting display panel and a driving method thereof, and an organic light-emitting display device.

BACKGROUND

An organic light-emitting diode (OLED) is a diode that realizes display using reversible color changes generated by an organic semiconductor material driven by a current. A basic structure of an OLED display device usually includes a hole transport layer, a light-emitting layer, and an electron transport layer. When a power supply supplies an appropriate voltage, a hole of an anode and electrons of a cathode can be combined together in the light-emitting layer to produce light. Compared with a thin-film field-effect transistor liquid crystal display, the OLED display device is characterized by high visibility and high brightness, more energy-efficient, light-weight, and thin in thickness. Therefore, the OLED display device is regarded as one of the most promising products in the twenty-first Century.

Because the brightness of the OLED is related to the magnitude of the current passing through the OLED, the electrical properties of a thin-film transistor used for driving will directly influence the display effect, and particularly a threshold voltage of the thin-film transistor often drifts to enable the entire OLED display device to generate a problem of uneven brightness.

In order to improve the display effect of the OLED, the threshold voltage of the driving transistor usually needs to be detected in real time, and pixel compensation is then carried out on the OLED through the pixel driving circuit. The existing pixel driving circuit requires a large number of metal wires to detect a threshold voltage of the driving transistor, which results in that the pixel driving circuit occupies a larger space in the OLED display device, and a narrow frame of the OLED display device is difficult to realize.

SUMMARY

The present application aims to provide a touch display panel, a touch display device and a touch detection method to solve the technical problems mentioned in the background section.

In a first aspect, the present application provides a touch display panel, comprising: an array arrangement comprising a plurality of pixel units, a plurality of data lines and a plurality of reference signal lines, wherein each pixel unit comprises a first subpixel, a second subpixel, a third subpixel and a fourth subpixel; a pixel circuit is formed in each subpixel, each data line is electrically connected with the subpixels arranged in a column direction, and the pixel circuit comprises a driving transistor and an organic light-emitting diode; the first subpixel, the second subpixel, the third subpixel and the fourth subpixel of an identical pixel unit are arranged in a row direction and are electrically connected with a given reference signal line; a color of the first subpixel, a color of the second subpixel, a color of the third subpixel and a color of the fourth subpixel differ from one another, and the color of the first subpixel, the color the second subpixel and the color the third subpixel are red, blue and green, respectively; and the color of the fourth subpixel is not white.

In a second aspect, the present application provides a driving method for the organic light-emitting display panel, the driving method is characterized by application to the organic light-emitting display panel described in the above embodiment, the working time of the organic light-emitting display panel includes a threshold detection phase, and the method includes: sequentially providing data signals to the data lines to drive the first subpixel, the second subpixel, the third subpixel and the fourth subpixel in each pixel unit; and acquiring a threshold voltage of each driving transistor in the pixel unit through the reference signal lines electrically connected with an identical pixel unit.

In a third aspect, the present application provides an organic light-emitting display device including the organic light-emitting display panel described in the above embodiment.

According to the organic light-emitting display panel and the driving method thereof, and the organic light-emitting display device provided by the present application, a plurality of pixel units in array arrangement are arranged on the organic light-emitting display panel, four subpixels are arranged in each pixel unit, and the four subpixels in an identical pixel unit share one reference signal line at the same time, so that the number of metal lines arranged in a pixel driving circuit is reduced so as to reduce the space occupied by the metal lines in an OLED display device; and meanwhile, in the present embodiment, the colors of the four subpixels are set to form a combination of red, green, blue and non-white, so that the display color gamut of the organic light-emitting display device can be effectively improved, the color reproduction capacity of the organic light-emitting display device is improved, and the display power consumption is reduced.

BRIEF DESCRIPTION OF THE DRAWINGS

Other features, objectives and advantages of the present application will become more apparent by reading a detailed description of the nonrestrictive embodiments made with reference to the following drawings.

DETAILED DESCRIPTION OF EMBODIMENTS

The present application will be further described below in detail in combination with the accompanying drawings and the embodiments. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 1:
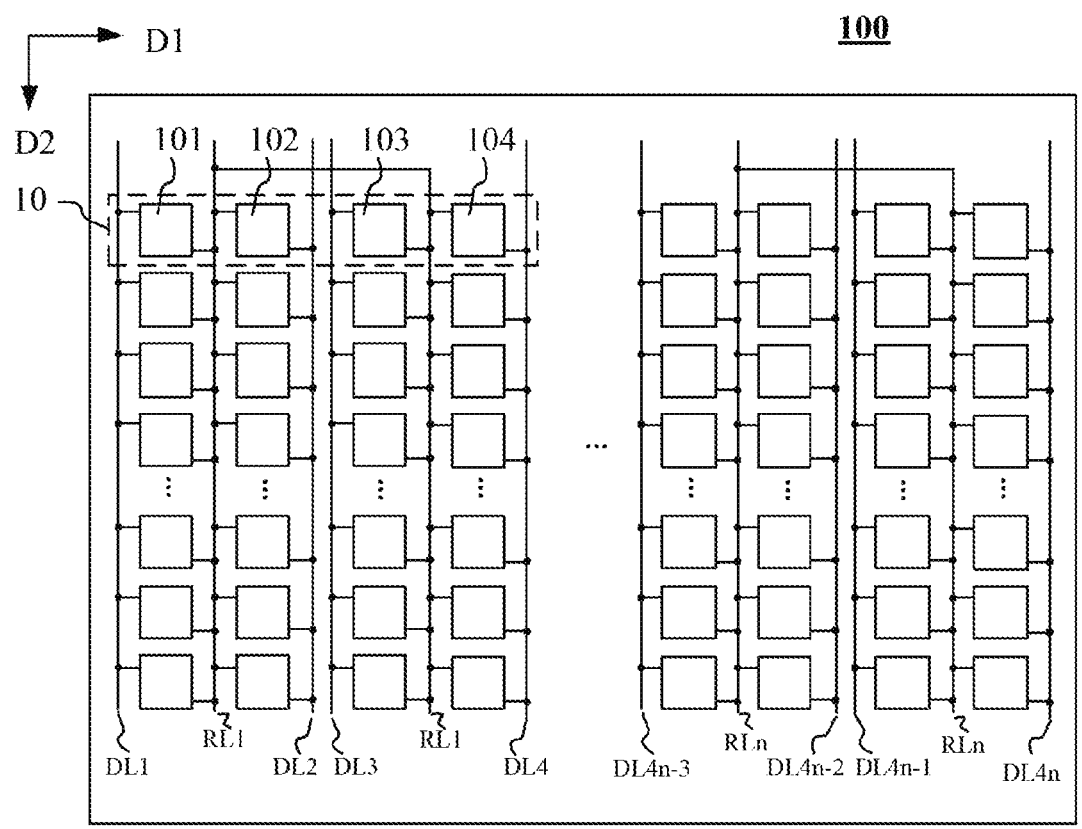
FIG. 1 is a structure diagram of one embodiment of the organic light-emitting display panel according to the present application.

FIG. 1 shows a structure diagram of one embodiment of the organic light-emitting display panel according to the present application. As shown in FIG. 1, the organic light-emitting display panel 100 of the present embodiment includes a plurality of pixel units 10, a plurality of data lines (DL1-DL4n) and a plurality of reference signal lines (RL1-RLn) in array arrangement. Wherein, each pixel unit 10 includes four subpixels, namely a first subpixel 101, a second subpixel 102, a third subpixel 103 and a fourth subpixel 104. A pixel circuit is formed in each subpixel, and includes a driving transistor and an organic light-emitting diode, the driving transistor can provide driving current to the organic light-emitting diode, and the organic light-emitting diode turns on to emit light under the action of the driving current, thereby lightening the organic light-emitting display panel 100. The subpixels arranged in a column direction (e.g., a second direction D2 shown in FIG. 1) are electrically connected with a data line, and as shown in FIG. 1, a first column of the subpixels is electrically connected with a data line DL1, a second column of the subpixels is electrically connected with a data line DL2 . . . and a $3N^{th}$ column of the subpixels is electrically connected with a data line DL3N.

The first subpixel 101, the second subpixel 102, the third subpixel 103 and the fourth subpixel 104 in the pixel unit 10 are arranged in a row direction and are electrically connected with a given reference signal line. As shown in FIG. 1, the first column of the subpixels, the second column of the subpixels, the third column of the subpixels and the fourth column of the subpixels are electrically connected with the reference signal line RL1, . . . , and the $(4n-3)^{th}$ column of the subpixels, the $(4n-2)^{th}$ column of subpixels, the $(4n-1)^{th}$ column of the subpixels and the $4n^{th}$ column of the subpixels are electrically connected with the reference signal line RLn.

In this way, as the four subpixels share one reference signal line, the space occupied by the pixel driving circuit of each pixel in the organic light-emitting display panel 100 is effectively reduced; and meanwhile, during detection of a threshold voltage of a driving module of each subpixel, loads of the reference signal lines are consistent, so that the precision of the detected threshold voltage of each subpixel can be effectively improved.

Further, in the present embodiment, the colors of the four subpixels in an identical pixel unit are red, green, blue and non-white, respectively, and the non-white, for example, may be one of yellow, cyan or purple. Thus, the organic light-emitting display panel 100 can display a wider color gamut, has higher color reproduction capability, and can also reduce display power consumption.

According to the organic light-emitting display panel provided by the above embodiment of the present application, a plurality of pixel units in array arrangement are arranged on the organic light-emitting display panel, four subpixels are arranged in each pixel unit, and the four subpixels in an identical pixel unit share one reference signal line at the same time, so that the number of metal lines arranged in a pixel driving circuit is reduced so as to reduce the space occupied by the metal lines in an OLED display device; and meanwhile, in the present embodiment, the colors of the four subpixels are set to form a combination of red, green, blue and non-white, so that the display color gamut of the organic light-emitting display device can be effectively improved, the color reproduction capacity of the organic light-emitting display device is improved, and the display power consumption is reduced.

In some optional implementations of the present embodiment, the fourth subpixel in the pixel unit 10 is a yellow subpixel.

Because pure colors of red, green and blue are rarely found in colors existing in nature, most colors are complementary colors of red, green and blue three base colors. Yellow occupies a large part in the complementary colors of the three base colors, and the brightness of yellow is second only to that of white, thus a displayed picture can be represented more brightly, especially "golden", "shining metal color", "bright yellow" and the like, which are difficult to represent in a three-base-color technology, can be reproduced more vividly. At the same time, a yellow subpixel is added on the basis of the three base colors, and a blue color gamut can be stretched, so that the ability to express blue and green is stronger.

In some optional implementations of the present embodiment, the colors of the four subpixels in the pixel unit may be realized by setting an organic light-emitting diode emitting white light and a color filter diaphragm in each subpixel.

In the present implementation, the organic light-emitting display panel may realize full-color display by using the OLED emitting white light and using a color light filter on an emergent light side of the OLED emitting the white light to filter out R, G and B three types of primary color light.

In some optional implementations of the present embodiment, the colors of the four subpixels in the pixel unit may be realized by setting an organic light-emitting diode emitting blue light and a color conversion layer in each subpixel.

In the present implementation, the organic light-emitting display panel may uses the OLED emitting blue light as a light emitting source, and converts the light emitted by the OLED emitting the blue light into R, G and B three types of primary color light by using a color conversion film, thereby obtaining full colors.

In some optional implementations of the present embodiment, the colors of the four subpixels in the pixel unit may be realized by setting an organic light-emitting diode emitting red light, an organic light-emitting diode emitting blue light and an organic light-emitting diode emitting green light in the pixel unit.

In the present implementation, the organic light-emitting display panel may adopt an RGB pixel emitting light independently, and the principle is that R, G and B three types of organic light-emitting materials are filmed in parallel on an ITO substrate, and full-color display is realized by changing a color mixing ratio by controlling brightness of the three types of light-emitting pixels.

Figure 2:
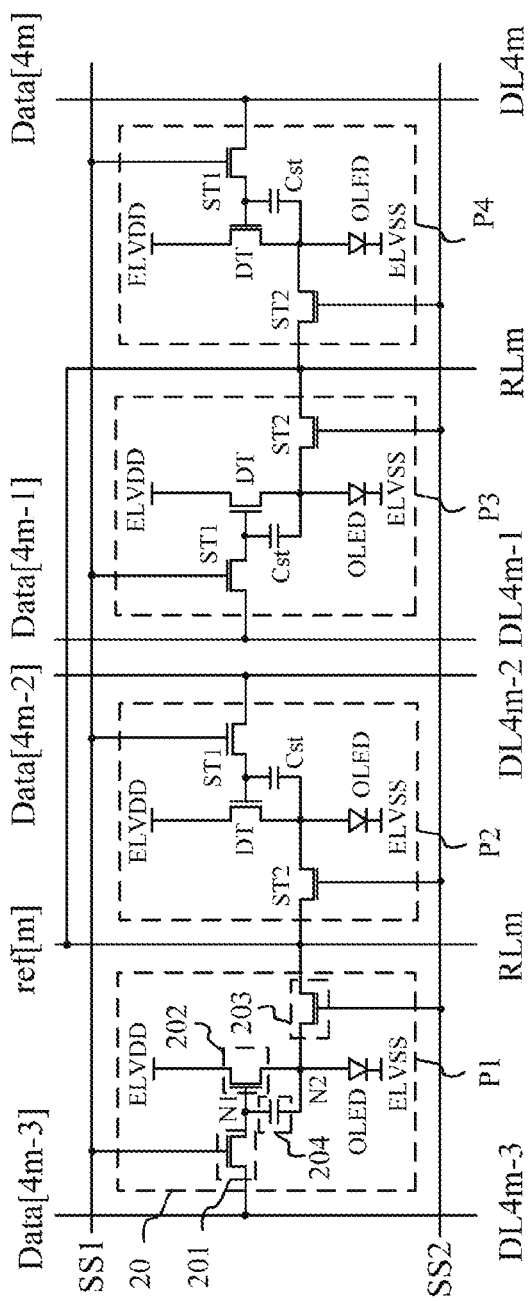
FIG. 2 is a structure diagram of a pixel driving circuit in a pixel unit of the organic light-emitting display panel shown in FIG. 1.

FIG. 2 shows a structure diagram of a pixel driving circuit in a pixel unit of the organic light-emitting display panel shown in FIG. 1. Each pixel driving circuit as shown in FIG. 2 drives each organic light-emitting diode (OLED). As shown in FIG. 2, the pixel unit of the organic light-emitting display panel includes subpixels P1, P2, P3 and P4, and each subpixel has an identical pixel driving circuit.

The pixel driving circuit of the present embodiment may include: a data writing module 201, a driving module 202, an initialization module 203, an electricity storage module 204 and an organic light-emitting diode (OLED). Wherein, the data writing module 201 includes a first transistor ST1, the driving module 202 includes a driving transistor DT, the initialization module 203 includes a second transistor ST2, and the electricity storage module 204 includes a storage capacitor Cst.

The pixel driving circuit of the present embodiment may further include a first scanning line SS1 and a second scanning line SS2. Wherein, the subpixels P1, P2, P3 and P4 are electrically connected with the first scanning line SS1 and the second scanning line SS2. Specifically, a gate of the first transistor ST1 in each subpixel is electrically connected with the first scanning line SS1, and a gate of the second transistor ST2 in each subpixel is electrically connected with the second scanning line SS2. In other words, the pixel driving circuit of the present embodiment controls turn-on and turn-off of the first transistor ST1 and the second transistor ST2 through the first scanning line SS1 and the second scanning line SS2.

The pixel driving circuit of the present embodiment may further include a plurality of data lines electrically connected with the subpixels extending in a column direction, including, as shown in FIG. 2, a data line DL4$m$-3 electrically connected with the subpixel P1, a data line DL4$m$-2 electrically connected with the subpixel P2, a data line DL4$m$-1 electrically connected with the subpixel P3, and a data line DL4$m$ electrically connected with the subpixel P4. Specifically, a first electrode of each first transistor ST1 is electrically connected with a corresponding data line.

The pixel driving circuit of the present embodiment may further include a plurality of reference signal lines, a plurality of first supply voltage lines and a plurality of second supply voltage lines. Wherein, the four subpixels P1, P2, P3 and P4 belonging to an identical pixel unit are electrically connected with a given reference signal line. The first electrode of the driving transistor DT is electrically connected with a first supply voltage line, and the cathode of the organic light-emitting diode (OLED) is electrically connected with a second supply voltage line.

Specifically, a gate of the first transistor ST1 of each subpixel is electrically connected with the first scanning line SS1, a first electrode of the first transistor ST1 is electrically connected with a corresponding data line, and a second electrode of the first transistor ST1 is electrically connected with a gate of the driving transistor DT and one end of the storage capacitor Cst; a first electrode of the driving transistor DT is electrically connected with the first supply voltage line, and a second electrode of the driving transistor DT is electrically connected with the anode of the organic light-emitting diode (OLED), a second electrode of the second transistor ST2, and the other end of the storage capacitor Cst; a gate of the second transistor ST2 is electrically connected with the second scanning line SS2, and a first electrode of the second transistor ST2 is electrically connected with a corresponding reference signal line; and the cathode of the organic light-emitting diode (OLED) is electrically connected with a second supply voltage line.

The first scanning line SS1 provides a first control signal Scan1 to each first transistor ST1 to control turn-on and turn-off of the first transistor ST1. The second scanning line SS2 provides a second control signal Scan2 for each second transistor ST2 to control turn-on and turn-off of the second transistor ST2. The data lines are used for providing data signal voltages Vdata. The first supply voltage line and the second supply voltage line are used for providing a first supply voltage ELVDD and a second supply voltage ELVSS to each pixel driving circuit, and the first supply voltage ELVDD is greater than the second supply voltage ELVSS. The reference signal lines are used for providing a reference signal voltage Vref to each second transistor ST2.

In some optional implementations of the present embodiment, the first transistor ST1, the second transistor ST2 and the driving transistor DT are P-type transistors.

In some optional implementations of the present embodiment, the organic light-emitting display panel may further include an integrated circuit not shown in FIG. 1, and the plurality of data lines, the plurality of reference lines and the plurality of scanning lines are electrically connected with the integrated circuit.

Hereinafter, in combination with FIGS. 3$a$-FIG. 3$e$, refer to a working time sequence of the pixel driving circuit shown in FIG. 2. The working time of the organic light-emitting display panel includes a threshold detection phase and a light emitting phase, and each pixel driving circuit detects a threshold voltage of the driving transistor in each subpixel in the threshold detection phase. FIG. 3$a$ is a working time sequence diagram of detection of a threshold voltage of the driving transistor of the first subpixel P1 of the pixel unit, FIG. 3$b$ is a working time sequence diagram of detection of a threshold voltage of the driving transistor of the second subpixel P2 of the pixel unit, FIG. 3$c$ is a working time sequence diagram of detection of a threshold voltage of the driving transistor of the third subpixel P3 of the pixel unit, FIG. 3$d$ is a working time sequence diagram of detection of a threshold voltage of the driving transistor of the third subpixel P4 of the pixel unit, and FIG. 3$e$ is a working time sequence diagram of a display phase of the pixel unit. The working time sequence shown in FIG. 3$a$ is a first subphase of the threshold detection phase of the pixel unit, the working time sequence shown in FIG. 3$b$ is a second subphase of the threshold detection phase of the pixel unit, the working time sequence shown in FIG. 3$c$ is a third subphase of the threshold detection phase of the pixel unit, and the working time sequence shown in FIG. 3$d$ is a fourth subphase of the threshold detection phase of the pixel unit.

As shown in FIG. 3$a$, the threshold detection phase of each pixel may include an initialization phase (such as a phase A in the FIG.), a discharge phase (such as a phase B in the FIG.) and an acquisition phase (such as a phase C in the FIG.).

In the initialization phase A, the integrated circuit provides a first control signal Scant and a second control signal Scan2 to the first scanning line SS1 and the second scanning line SS2 respectively, a data voltage signal Vdata[4$m$-3] to the data line DL4$m$-3, a black data voltage Vblack to the data line DL4$m$-2, the data line DL4$m$-1 and the data line DL4$m$ respectively, thus, the subpixel P1 is turned on, and the subpixel P2, the subpixel P3 and the subpixel P4 are turned off. The integrated circuit provides a reference voltage signal ref[m] to the reference signal line RLm. Because the first control signal Scant and the second control signal Scan2 are high levels, the first transistor ST1 and the second transistor ST2 of the subpixel P1 turn on, the first transistor ST1 transmits the data voltage signal Vdata[4m-3] to a first node N1, and the second transistor ST2 transmits the reference voltage Vref to a second node N2 to complete initialization of the driving transistor of the subpixel P1.

In the discharge phase B, the integrated circuit still provides the first control signal Scant and the second control signal Scan2 to the first scanning line SS1 and the second scanning line SS2 to turn on the first transistors ST1 and the second transistors ST2 of the subpixel P1, and the pixel current of the driving transistors DT of the subpixel P1 is output to the reference signal line RLm through each second transistor ST2 respectively, so that the voltage of the reference signal line RLm increases from Vref in direct proportion to the pixel current of the driving transistor DT until it is saturated after reaching a voltage corresponding to a difference between the data voltage signal and the threshold voltage of the driving transistor DT. That is to say, the voltage of the reference signal line RLm is saturated after rising to Vdata[4m-3]-Vth. The data signals provided by the integrated circuit to the data lines are unchanged.

In the sampling phase C, the integrated circuit samples the saturation voltage Vdata[4m-3]-Vth of the reference signal line RLm, and determines the threshold voltage of the driving transistor DT of the subpixel P1 in combination with the data voltage Vdata[4m-3], so as to complete detection of the threshold voltage of the driving transistor DT of the subpixel P1.

Figure 3A:
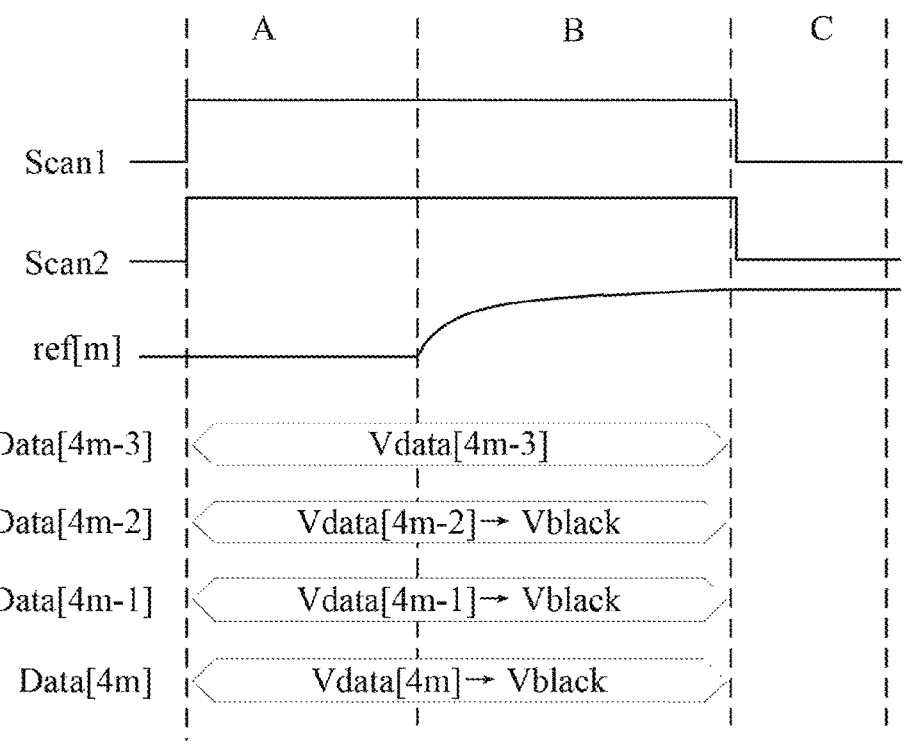
FIG. 3a-FIG. 3e are working time sequence diagrams of pixel driving circuits in the pixel unit shown in FIG. 2 in different working phases.
Figure 3B:
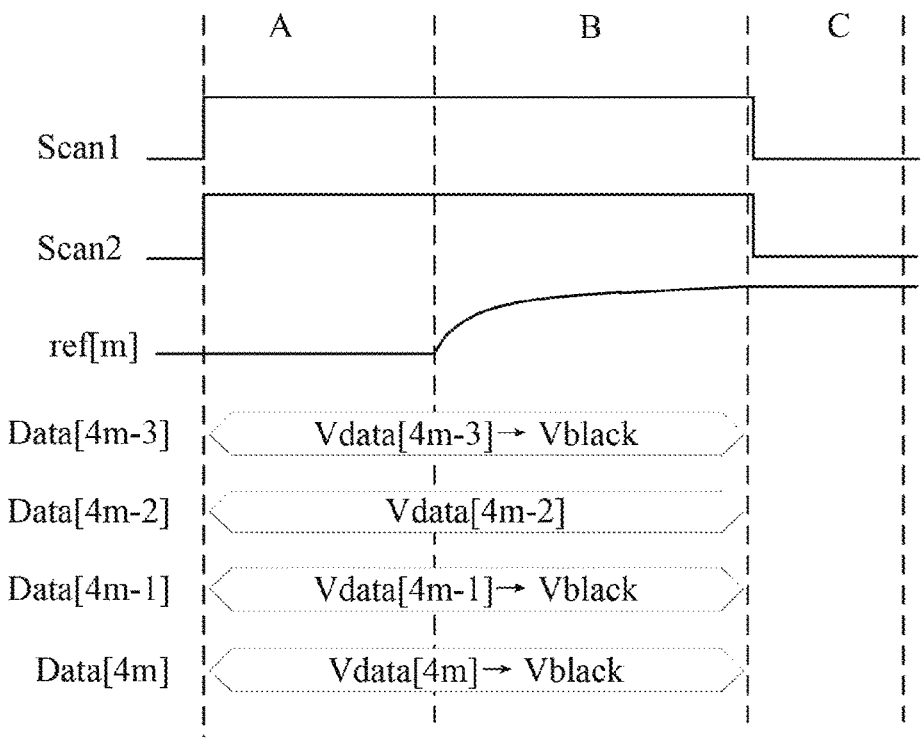

The working time sequence shown in FIG. 3b is similar to that shown in FIG. 3a, and the difference is that FIG. 3b shows detection of the threshold voltage of the driving transistor DT in the subpixel P2. Therefore, the integrated circuit provides a black data voltage Vblack to the data line DL4m-3, a data voltage signal Vdata[4m-2] to the data lineDL4m-2, and a black data voltage Vblack to the data line DL4m-1 and the data line DL4m.

Figure 3C:
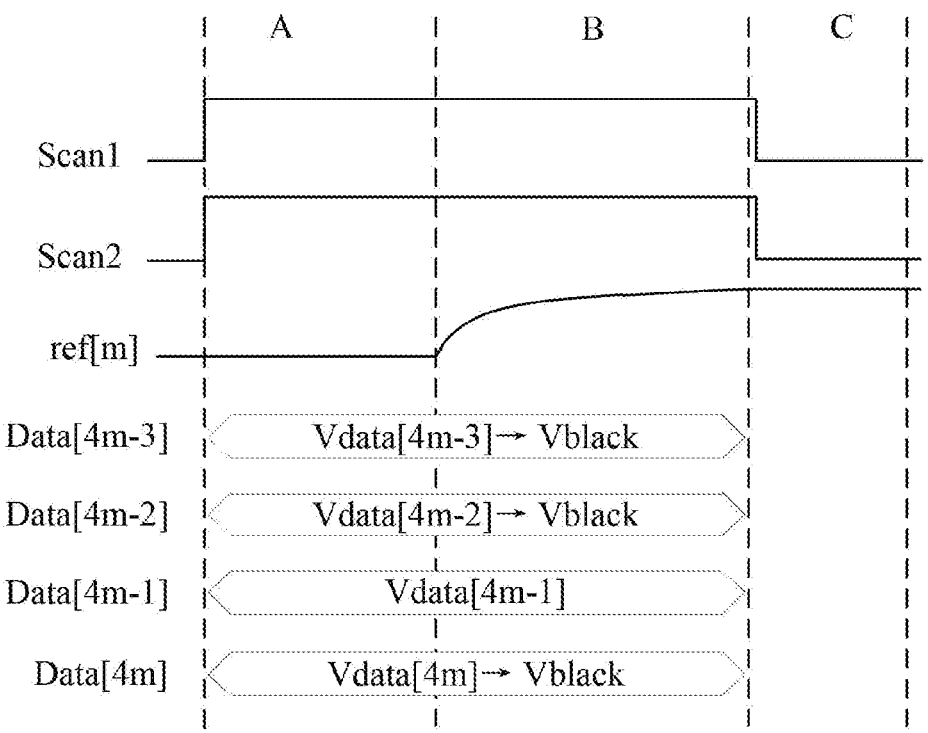

The working time sequence shown in FIG. 3c is similar to that shown in FIG. 3a, and the difference is that FIG. 3c shows detection of the threshold voltage of the driving transistor DT in the subpixel P3. Therefore, the integrated circuit provides a black data voltage Vblack to the data line DL4m-3 and the data line DL4m-2, a data voltage signal Vdata[4m-1] to the data line DL4m-1, and a black data voltage Vblack to the data line DL4m.

Figure 3D:
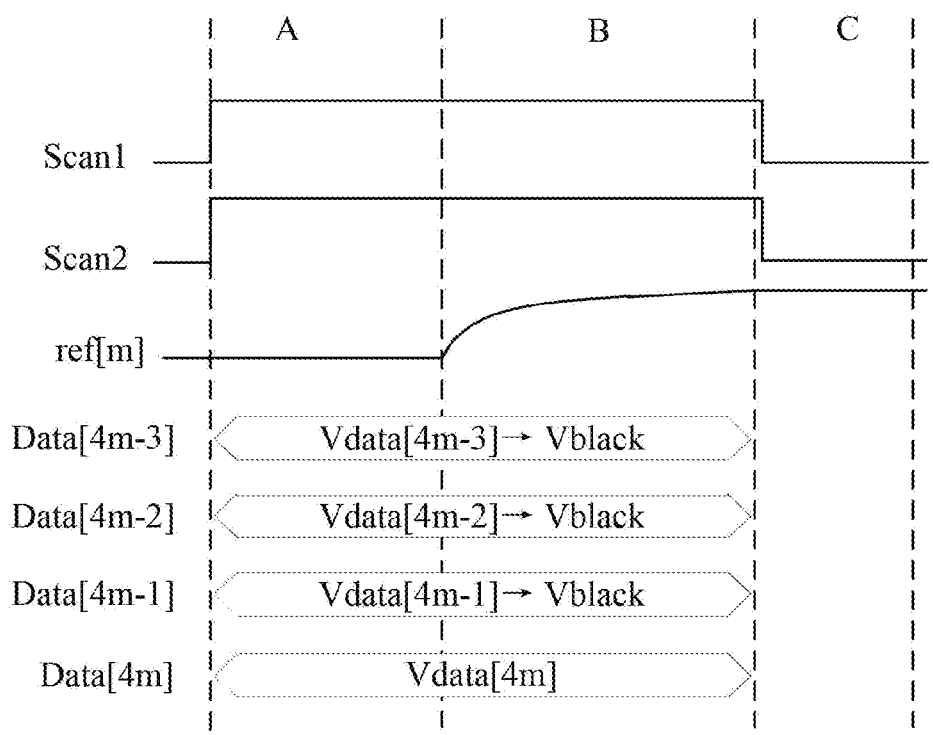

The working time sequence shown in FIG. 3d is similar to that shown in FIG. 3a, and the difference is that FIG. 3d shows detection of the threshold voltage of the driving transistor DT in the subpixel P4. Therefore, the integrated circuit provides a black data voltage Vblack to the data line DL4m-3, the data line DL4m-2 and the data line DL4m-1, and provides a data voltage signal Vdata[4m] to the data line DL4m.

In the display phase of the organic light-emitting display panel, the integrated circuit provides a first control signal Scant to the first scanning line SS1, a second control signal Scan2 to the second scanning line SS2, a data voltage signal Vdata[4m-3] to the data line DL4m-3, a data voltage signal Vdata[4m-2] to the data line DL4m-2, a data voltage signal Vdata[4m-1] to the data line DL4m-1, a data voltage signal Vdata[4m] to the data line DL4m, and a reference voltage signal Vref to the reference signal line RLm. Because the first control signal Scant and the second control signal Scan2 are high levels, the first transistor ST1 and the second transistor ST2 in each of the subpixels P1, P2, P3 and P4 turn on. Each storage capacitor Cst are respectively charged to a difference between each data voltage and the reference voltage, that is to say, the storage capacitor Cst of the subpixel P1 is charged to Vdata[4m-3]-Vref, the storage capacitor Cst of the subpixel P2 is charged to Vdata[4m-2]-Vref, the storage capacitor Cst of the subpixel P3 is charged to Vdata[4m-1]-Vref, and the storage capacitor Cst of the subpixel P4 is charged to Vdata[4m]-Vref. Then, the first control signal Scan1 and the second control signal Scan2 are changed into low levels, the first transistor ST1 and the second transistor ST2 in each subpixel are turned off, each driving transistor provides a current to each organic light-emitting diode (OLED) respectively, so that each organic light-emitting diode (OLED) emits light, and the organic light-emitting display panel is lightened.

The inventor discovers in the experiment that, with the increase of the usage time of the organic light-emitting display panel, the thin-film transistors ST1 and ST2 and the driving transistor DT in each of the subpixels P1, P2, P3 and P4 will gradually age. It can be seen from the above working time sequence, the aging of the driving transistor DT itself can be compensated after the threshold voltage of the driving transistor DT is detected, thereby making up for the defect of brightness reduction caused by the aging of the driving transistor DT itself. The aging of the thin-film transistors ST1 and ST2 in each of the subpixels P1, P2, P3 and P4 will cause increase of leakage currents of the thin-film transistors ST1 and ST2. Especially, the aging of the thin-film transistor ST1 will cause the voltage of the first node N1 to deviate from a set voltage value. With the aging of the thin-film transistor ST1, more and more leakage currents flow through the thin-film transistor ST1, and finally flow into the first node N1, and the potential of the first node N1 will deflect from a potential that the inventor intends to set. Moreover, the potential of the first node N1 determines the degree of opening of the driving transistor DT and ultimately determines the driving current flowing through the driving transistor DT. Therefore, with the aging of the thin-film transistor ST1 in each of the subpixels P1, P2, P3 and P4, the driving current flowing through the driving transistor DT is changed, so that the brightness of each of the subpixels P1, P2, P3 and P4 is changed. Due to the deflection of the potential of the first node N1, the deviation of the brightness of each of the subpixels P1, P2, P3 and P4 cannot be compensated by detecting the aging of the driving transistor DT, which is the problem that the inventor faces.

The inventor also found through experiments that with the subpixels P1, P2 and P3 being a red subpixel, a blue subpixel and a green subpixel respectively as an example, white light should be emitted after color mixing under the condition that the three subpixels are in a full gray scale (225-order brightness). However, with the increase of the usage time of the organic light-emitting display panel, the thin-film transistors ST1 and ST2 and the the driving transistor DT in each of the subpixels P1, P2, P3 and P4 will gradually age, and as mentioned above, the three subpixels emit yellow light after final color mixing, which affects the display effect of the organic light-emitting display panel, and is a result not expected by the inventor.

Based on the problems found in the experiments mentioned above, in the present embodiment, the inventor presents an organic light-emitting display panel including subpixels P1, P2, P3 and P4, wherein the subpixels P1, P2 and P3 are a red subpixel, a blue subpixel and a green subpixel respectively, and have different colors, and the subpixel P4 pixel is a yellow subpixel. In order to solve the problem that the light synthesized by the subpixels P1, P2 and P3 at a 225-order brightness yellows, in the present embodiment, the brightness of the subpixel P4 may be adjusted in the light emitting phase to ensure that the light synthesized by the subpixels P1, P2, P3 and P4 does not affect the display effect. Specifically, the amplitude of the data voltage signal provided to the subpixel P4 may be adjusted according to the deterioration degrees of the subpixels P1, P2 and P3. The deterioration degrees here may be yellowing degrees of the light synthesized by the subpixels P1, P2 and P3 at the 225-order brightness.

Specifically, aging experiments may be carried out on the subpixels P1, P2 and P3 to obtain a curve between the yellowing degree of the light synthesized by a red subpixel R, a blue subpixel B and a green subpixel G and a test time. A yellowing degree threshold is set according to actual display needs, and when the yellowing degree of the light synthesized by the red subpixel R, the blue subpixel B and the green subpixel G exceeds the yellowing degree threshold, the amplitude of the data voltage signal transmitted to the data line electrically connected with the subpixel P4 is adjusted to reduce the brightness of the light emitted by the subpixel P4, and ensure that the light synthesized by the subpixels P1, P2, P3 and P4 is balanced in display effect, and will not change obviously with the increase of the usage time of the organic light-emitting display panel.

With the increase of the usage time of the organic light-emitting display panel, the yellowing degree of the light synthesized by the red subpixel R, the blue subpixel B and the green subpixel G is getting worse, thus, the amplitude of the data voltage signal provided to the subpixel P4 can be set by the integrated circuit to progressively decrease with the increase of the yellowing degree.

In some optional implementations of the present embodiment, the threshold detection phase may further include a precharge phase not shown in FIGS. 3a-3d. In the precharge phase, the second control signal Scan2 provided by the integrated circuit to the second scanning line SS2 becomes a low level, and the second transistor ST2 is then turned off. At the same time, the integrated circuit provides a precharge voltage Vpre to the reference signal line ref[m], and the reference signal line ref[m] is then precharged to the precharge voltage Vpre. It should be appreciated that the precharge voltage Vpre is greater than the reference voltage Vref.

Figures 3E, 4:
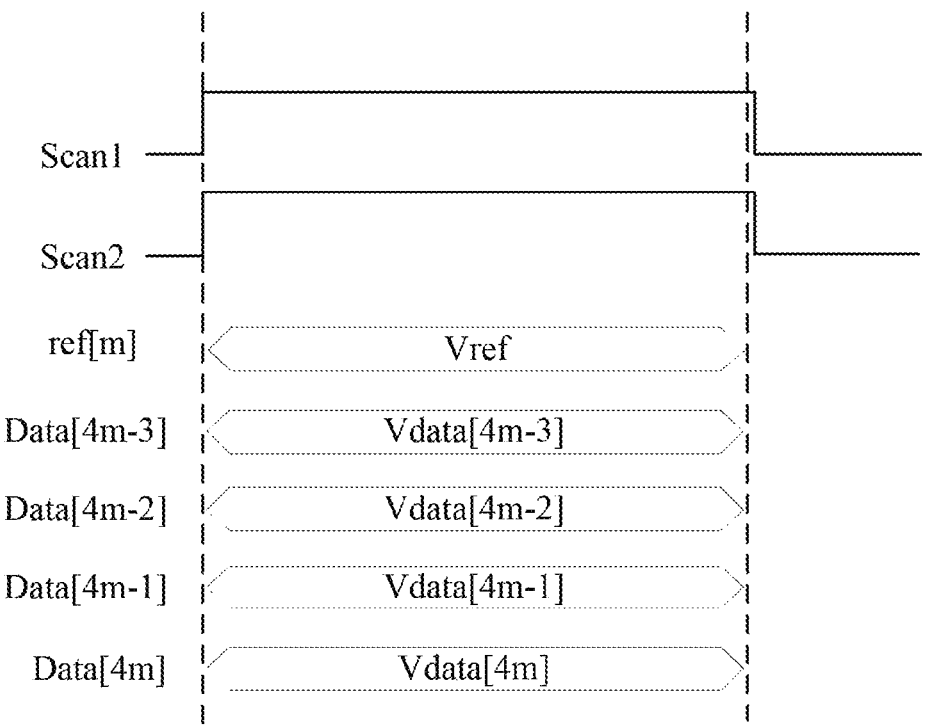
FIG. 4 is a flow diagram of one embodiment of the driving method of the organic light-emitting display panel according to the present application.

Continue to refer to FIG. 4, it shows a flow diagram 400 of one embodiment of the driving method of the organic light-emitting display panel according to the present application. The driving method of the present embodiment may be applied to the organic light-emitting display panel described in the above embodiment, and the working time of the organic light-emitting display panel includes a threshold detection phase. As shown in FIG. 4, the driving method of the present embodiment may include the following steps:

Step 401, sequentially providing data signals to the data lines to drive the first subpixel, the second subpixel and the third subpixel in each pixel unit.

In the present embodiment, the data signals may be sequentially provided to the data lines electrically connected with the first subpixel, the second subpixel, the third subpixel and the fourth subpixel in the pixel unit to sequentially drive the first subpixel, the second subpixel, the third subpixel and the fourth subpixel.

Step 402, acquiring the threshold voltages of driving transistors in an identical pixel unit through the reference signal line electrically connected with the pixel unit.

After the driving transistors of the first subpixel, the second subpixel, the third subpixel and the fourth subpixel in the pixel unit are driven, the threshold voltage of each driving transistor in the pixel unit may be acquired through reference signal lines electrically connected with the pixel unit, and pixel compensation is then performed on each pixel unit according to the threshold voltage of each driving transistor.

In some optional implementations of the present embodiment, the organic light-emitting display panel further includes a plurality of scanning lines, and each pixel circuit in the pixel unit is electrically connected with a first scanning line and a second scanning line. The pixel circuit further includes a first transistor, a second transistor and a storage capacitor, wherein the first transistor is used for transmitting a data signal on a data line to a gate of the driving transistor based on the signal of the first scanning line, and the second transistor is used for transmitting a signal of a reference signal line to a second electrode of the driving transistor based on the signal of the second scanning line. The threshold detection phase includes a first subphase, a second subphase, a third subphase and a fourth subphase, and each of the first subphase, the second subphase, the third subphase and the fourth subphase includes an initialization phase, a discharge phase and a sampling phase. The driving method may further be implemented by the following steps not shown in FIG. 4:

In the initialization phase, providing a data voltage signal to a data line and a reference voltage signal to a reference signal line, the first transistor transmitting the data voltage signal to a grate of the driving transistor based on the first scanning line, and the second transistor transmitting the reference voltage signal to an anode of an organic light-emitting diode based on a signal of the second scanning line to complete initialization of the driving transistor and the organic light-emitting diode; in the discharge phase, continuing to provide a data voltage signal to the data line, the first transistor transmitting the data voltage signal to the gate of the driving transistor based on the first scanning line, and the second transistor transmitting the reference voltage signal to the anode of the organic light-emitting diode based on the second scanning line to saturate the driving transistor and drive a pixel current of the driving transistor to flow to the reference signal line; and in the sampling phase, the first transistor turning off based on the signal of the first scanning line and the second transistor turning off based on the signal of the second scanning line acquiring saturation voltages on the reference signal line, and determining a threshold voltage of the driving transistor.

In some optional implementations of the present embodiment, the working time of the organic light-emitting display panel further includes a light emitting phase, and the driving method includes: in the light emitting phase, providing a reference voltage signal to each reference data line, providing a data voltage signal to each data line, the first transistor transmitting the data voltage signal to the gate of the driving transistor based on the signal of the first scanning line, and the second transistor transmitting the reference voltage signal to the second electrode of the driving transistor based on the signal of the second scanning line to turn on the driving transistor and enable the organic light-emitting diode to emit light.

Considering that the thin-film transistors in each of the subpixels P1, P2, P3 and P4 age with the increase of the usage time of the organic light-emitting display panel to result in that the light synthesized by the subpixels P1, P2 and P3 at 225-order brightness is yellowish, in the present implementation, when a data signal is provided to the fourth subpixel of each pixel unit, the amplitude of the data signal can also be set to progressively decrease with the deterioration degree of the subpixels P1, P2 and P3.

According to the driving method provided by the above embodiment of the present application, the threshold voltage of each driving transistor in the pixel unit can be effectively detected, the compensation of each pixel in the organic light-emitting display panel is then can be implemented, and the brightness of the organic light-emitting display panel is balanced.

Figure 5:
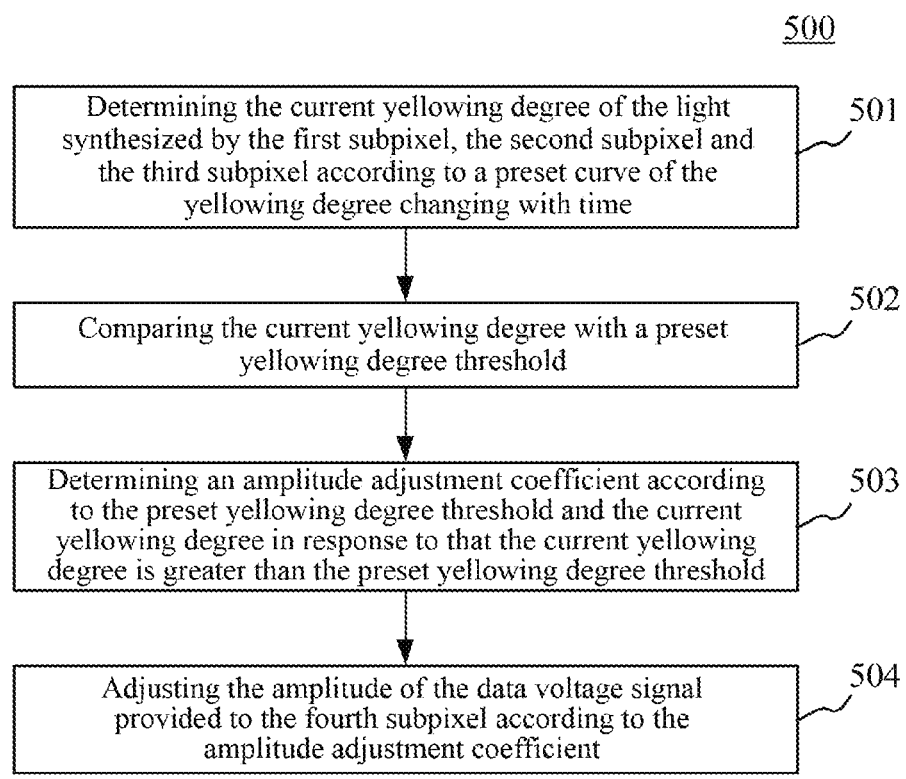
FIG. 5 is a flow diagram of adjusting the amplitude of the data voltage signal provided to the fourth subpixel in the driving method of the organic light-emitting display panel according to the present application.

Continue to refer to FIG. 5, it shows a process 500 of adjusting the amplitude of the data voltage signal provided to the fourth subpixel in the driving method of the organic light-emitting display panel according to the present application. In the present embodiment, the deterioration degree may include the yellowing degree of the light synthesized by the first subpixel, the second subpixel and the third subpixel at 225-order brightness. As shown in FIG. 5, the present embodiment may implement adjustment of the amplitude of the data voltage signal provided to the fourth subpixel through the following steps:

Step 501, determining the current yellowing degree of the light synthesized by the first subpixel, the second subpixel and the third subpixel according to a preset curve of the yellowing degree changing with time.

In the present embodiment, a curve of the yellowing degree changing with time of the light synthesized by the red subpixel, the green subpixel and the blue subpixel may be predetermined. Specifically, the red subpixel, the green subpixel and the blue subpixel may always be in a light-emitting state, the yellowing degree of the light synthesized by the above three subpixels is tested at any time, and the curve of the yellowing degree changing with time is recorded. After the above curve is obtained, a light-emitting time of the first subpixel, the second subpixel and the third subpixel may be determined according to a display time of the organic light-emitting display panel, and the current yellowing degree of the three subpixels is then determined according to the above light-emitting time.

Step 502, comparing the current yellowing degree with a preset yellowing degree threshold.

After the current yellowing degree of the organic light-emitting display panel is determined, it can be compared with the preset yellowing degree threshold. Wherein, the preset yellowing degree threshold may be a threshold set by those skilled in the art according to actual display needs, and when the current yellowing degree is greater than the preset yellowing degree threshold, the organic light-emitting display panel may be adjusted.

Step 503, determining an amplitude adjustment coefficient according to the preset yellowing degree threshold and the current yellowing degree in response to that the current yellowing degree is greater than the preset yellowing degree threshold.

In the present embodiment, because the fourth subpixel is a yellow subpixel, when the organic light-emitting display panel is adjusted, the brightness of a yellow subpixel can be adjusted by adjusting the amplitude of the data voltage signal provided to the fourth subpixel to eventually affect the display effect of the light synthesized by the red subpixel, the green subpixel, the blue subpixel and the yellow subpixel. When the above amplitude is adjusted, an amplitude adjustment coefficient may be determined according to the preset yellowing degree threshold and the current yellowing degree, for example, a ratio of the preset yellowing degree threshold to the current yellowing degree can be calculated, and used as the amplitude adjustment coefficient.

Step 504, adjusting the amplitude of the data voltage signal provided to the fourth subpixel according to the amplitude adjustment coefficient.

After the amplitude adjustment coefficient is determined, the amplitude of the data voltage signal provided to the fourth subpixel may be adjusted according to the amplitude adjustment coefficient. Specifically, when the amplitude adjustment coefficient is less than 1, the amplitude adjustment coefficient can be multiplied with the amplitude of the data voltage signal before adjustment; and when the amplitude adjustment coefficient is more than 1, the amplitude adjustment coefficient can be divided by the amplitude of the data voltage signal before adjustment to reduce the amplitude of the data voltage signal and realize adjustment.

According to the driving method of the organic light-emitting display panel provided by the above embodiment of the present application, whether the organic light-emitting display panel needs to be adjusted is determined by testing the yellowing degree of the light synthesized by the red subpixel, the green subpixel and the blue subpixel; and when adjustment is needed, the brightness of the yellow light emitted by the yellow subpixel is reduced by reducing the amplitude of the data voltage signal provided to the yellow subpixel, thereby ensuring the display effect of the light synthesized by the red subpixel, the green subpixel and the blue subpixel and the yellow subpixel, and improving the user experience.

Figure 6:
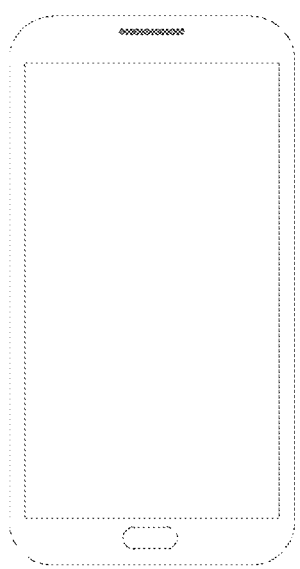
FIG. 6 is a structure diagram of one embodiment of the organic light-emitting display device according to the present application.

As shown in FIG. 6, the present application further provides an organic light-emitting display device 600 including the organic light-emitting display panel described in the above embodiments. According to the organic light-emitting display device 600, a plurality of pixels on the organic light-emitting display panel are divided into a plurality of pixel units, each pixel unit includes three subpixels, each column of the subpixels is electrically connected with a data line, and the three subpixels of an identical pixel unit are arranged in a row direction and are electrically connected with a given reference signal line. The organic light-emitting display panel of the present application effectively reduces the number of metal lines arranged in each pixel driving circuit, and reduces the space occupied in the OLED display device. Meanwhile, the organic light-emitting display device 600 of the present application can still ensure that displayed colors are bright and the display effect is improved when the first subpixel, the second subpixel and the third subpixel are deteriorated due to a long usage time.

The above description only provides an explanation of the preferred embodiments of the present application and the technical principles used. It should be appreciated by those skilled in the art that the inventive scope of the present application is not limited to the technical solutions formed by the particular combinations of the above-described technical features. The inventive scope should also cover other technical solutions formed by any combinations of the above-described technical features or equivalent features thereof without departing from the concept of the disclosure. Technical schemes formed by the above-described features being interchanged with, but not limited to, technical features with similar functions disclosed in the present application are examples.

What is claimed is:

1. An organic light-emitting display panel, comprising:
    an array arrangement comprising: a plurality of pixel units, a plurality of data lines, a plurality of reference signal lines, a plurality of scanning lines, and an integrated circuit,
    wherein the plurality of data lines, the plurality of reference lines, and the plurality of scanning lines are electrically connected with the integrated circuit;
    each pixel unit comprises a first subpixel, a second subpixel, a third subpixel and a fourth subpixel;
    a pixel circuit is formed in each subpixel, each data line is electrically connected with subpixels arranged in a column direction, and the pixel circuit comprises a driving transistor and an organic light-emitting diode;
    each pixel circuit is electrically connected with a first scanning line and a second scanning line;
    the pixel circuit further comprises a first transistor, a second transistor, and a storage capacitor, the first transistor is configured to transmit data voltage signals on the data line to the gate of the driving transistor based on a first scan signal of the first scanning line, and the second transistor is configured to transmit a reference voltage signal on the reference signal line to the second electrode of the driving transistor based on a second scan signal of the second scanning line;
    the first subpixel, the second subpixel, the third subpixel, and the fourth subpixel of an identical pixel unit are arranged in a row direction and are electrically connected with a given reference signal line;
    wherein a color of the first subpixel, a color of the second subpixel, a color of the third subpixel, and a color of the fourth subpixel differ from one another, the color of the first subpixel, the color of the second subpixel, and the color of the third subpixel are red, blue, and green, respectively, and the color of the fourth subpixel is not white;
    a working time of the organic light-emitting display panel comprises a light emitting phase;
    wherein in the light emitting phase, the integrated circuit provides the reference voltage signal to the reference data lines and provides the data voltage signals to the data lines, the first transistor transmits the data voltage signal to the gate of the driving transistor based on the first scan signal of the first scanning line, and the second transistor transmits the reference voltage signal to the second electrode of the driving transistor based on the second scan signal of the second scanning line to turn on the driving transistor and enable the organic light-emitting diode to emit light;
    wherein the integrated circuit determines a current yellowing degree of light synthesized by the first subpixel, the second subpixel, and the third subpixel at a 225-order brightness according to a preset curve of a yellowing degree changing with time;
    the integrated circuit compares the current yellowing degree with a preset yellowing degree threshold;
    the integrated circuit determines an amplitude adjustment coefficient according to the preset yellowing degree threshold and the current yellowing degree in response to that the current yellowing degree is greater than the preset yellowing degree threshold; and
    the integrated circuit adjusts the amplitude of the data voltage signal provided to the fourth subpixel according to the amplitude adjustment coefficient.

2. The organic light-emitting display panel according to claim 1, wherein the fourth subpixel is a yellow subpixel.

3. The organic light-emitting display panel according to claim 1, wherein the first transistor has a gate electrically connected with the first scanning line, a first end electrically connected with the data line, and a second end electrically connected with a gate of the driving transistor and one end of the storage capacitor;
    the driving transistor has a first end electrically connected with a first voltage input end, and a second end electrically connected with an input end of the organic light-emitting diode, a second end of the second transistor, and another end of the storage capacitor;
    the second transistor has a gate electrically connected with the second scanning line, and a first end electrically connected with the reference signal line; and
    an output end of the organic light-emitting diode is electrically connected with a second voltage input end.

4. The organic light-emitting display panel according to claim 1, wherein the driving transistor, the first transistor and the second transistor are P-type transistors.

5. The organic light-emitting display panel according to claim 1, wherein a working time of the organic light-emitting display panel further comprises a threshold detection phase, and the threshold detection phase comprises an initialization phase, a discharge phase and a sampling phase; in the initialization phase, the integrated circuit provides data voltage signals to the data lines, and provides reference voltage signals to the reference signal lines, the first transistor transmits the data voltage signal to the gate of the driving transistor based on the first scan signal of the first scanning line, and the second transistor transmits the reference voltage signal to the second electrode of the driving transistor based on the second scan signal of the second scanning line, so that the driving transistor completes initialization; in the discharge phase, the integrated circuit continues to provide data voltage signals to the data lines, the first transistor transmits the data voltage signal to the gate of the driving transistor based on the first scan signal of the first scanning line, and the second transistor transmits the reference voltage signal to the anode of the organic light-emitting diode based on the second scan signal of the second scanning line, so as to saturate the driving transistor, and enable a pixel current of the driving transistor to flow to the reference signal lines; and in the sampling phase, the first transistor turns off based on the first scan signal of the first scanning line, and the second transistor turns off based on the second scan signal of the second scanning line, and a saturation voltage on the reference signal line is acquired to determine a threshold voltage of the driving transistor.

6. The organic light-emitting display panel according to claim 5, wherein the threshold detection phase further comprises a precharge phase; and
    in the precharge phase, the integrated circuit provides data voltage signals to the data lines and provides precharge voltage signals to the reference signal lines, and the first transistor transmits the data voltage signal to the gate of the driving transistor based on the first scanning line, so as to complete precharge of the driving transistor.

7. The organic light-emitting display panel according to claim 1, wherein each subpixel comprises an organic light-emitting diode emitting white light and a color filter diaphragm.

8. The organic light-emitting display panel according to claim 1, wherein each subpixel comprises an organic light-emitting diode emitting blue light and a color conversion layer.

9. The organic light-emitting display panel according to claim 1, wherein each pixel unit comprises an organic light-emitting diode emitting red light, an organic light-emitting diode emitting blue light and an organic light-emitting diode emitting green light.

10. A method for driving the organic light-emitting display panel, wherein the method is applicable to the organic light-emitting display panel comprising:

an array arrangement comprising: a plurality of pixel units, a plurality of data lines, a plurality of reference signal lines, a plurality of scanning lines, and an integrated circuit, wherein the plurality of data lines, the plurality of reference lines, and the plurality of scanning lines are electrically connected with the integrated circuit;

each pixel unit comprises a first subpixel, a second subpixel, a third subpixel and a fourth subpixel;

a pixel circuit is formed in each subpixel, each data line is electrically connected with subpixels arranged in a column direction, and the pixel circuit comprises a driving transistor and an organic light-emitting diode;

each pixel circuit is electrically connected with a first scanning line and a second scanning line;

the pixel circuit further comprises a first transistor, a second transistor, and a storage capacitor, the first transistor is configured to transmit data voltage signals on the data line to the gate of the driving transistor based on a first scan signal of the first scanning line, and the second transistor is configured to transmit a reference voltage signal on the reference signal line to the second electrode of the driving transistor based on a second scan signal of the second scanning line;

the first subpixel, the second subpixel, the third subpixel, and the fourth subpixel of an identical pixel unit are arranged in a row direction and are electrically connected with a given reference signal line;

wherein a color of the first subpixel, a color of the second subpixel, a color of the third subpixel, and a color of the fourth subpixel differ from one another, the color of the first subpixel, the color of the second subpixel, and the color of the third subpixel are red, blue, and green, respectively, and the color of the fourth subpixel is not white;

wherein the method of driving the organic light-emitting display panel comprises:

sequentially providing data signals to the data lines to drive the first subpixel, the second subpixel, the third subpixel, and the fourth subpixel in each pixel unit; and acquiring threshold voltages of the driving transistors in an identical pixel unit through the reference signal line electrically connected with the pixel unit, wherein the method further comprises:

in the light emitting phase, providing the reference voltage signal to the reference data lines and providing the data voltage signals to the data lines, the first transistor transmitting the data voltage signal to the gate of the driving transistor based on the first scan signal of the first scanning line, and the second transistor transmitting the reference voltage signal to the second electrode of the driving transistor based on the second scan signal of the second scanning line to turn on the driving transistor and enable the organic light-emitting diode to emit light;

wherein the providing the data voltage signals to the data lines comprises:

determining a current yellowing degree of light synthesized by the first subpixel, the second subpixel and the third subpixel at a 225-order brightness according to a preset curve of a yellowing degree changing with time;

comparing the current yellowing degree with a preset yellowing degree threshold;

determining an amplitude adjustment coefficient according to the preset yellowing degree threshold and the current yellowing degree in response to that the current yellowing degree is greater than the preset yellowing degree threshold; and adjusting the amplitude of the data voltage signal provided to the fourth subpixel according to the amplitude adjustment coefficient.

11. The method according to claim 10, wherein the threshold detection phase further comprises a first subphase, a second subphase, a third subphase and a fourth subphase, and each of the first subphase, the second subphase, the third subphase and the fourth subphase comprises an initialization phase, a discharge phase and a sampling phase; and the method comprises: in the initialization phase, providing data voltage signals to the data lines, and providing reference voltage signals to the reference signal lines, the first transistor transmitting the data voltage signal to the gate of the driving transistor based on the first scan signal of the first scanning line, and the second transistor transmitting the reference voltage signal to the anode of the organic light-emitting diode based on the second scan signal of the second scanning line, so that the driving transistor and the organic light-emitting diode complete initialization; in the discharge phase, continuing to provide data voltage signals to the data lines, the first transistor transmitting the data voltage signal to the gate of the driving transistor based on the first scanning line, and the second transistor transmitting the reference voltage signal to the anode of the organic light-emitting diode based on the second scanning line, so as to saturate the driving transistor, and enable a pixel current of the driving transistor to flow to the reference signal line; and in the sampling phase, the first transistor turning off based on the first scanning line, and the second transistor turning off based on the second scanning line, and acquiring a saturation voltage on the reference signal line to determine a threshold voltage of the driving transistor.

12. An organic light-emitting display device, comprising:

an organic light-emitting display panel, comprising:

an array arrangement comprising a plurality of pixel units, a plurality of data lines, a plurality of reference signal lines, a plurality of scanning lines, and an integrated circuit, wherein the plurality of data lines, the plurality of reference lines, and the plurality of scanning lines are electrically connected with the integrated circuit;

each pixel unit comprises a first subpixel, a second subpixel, a third subpixel and a fourth subpixel;

a pixel circuit is formed in each subpixel, each data line is electrically connected with subpixels arranged in a column direction, and the pixel circuit comprises a driving transistor and an organic light-emitting diode;

each pixel circuit is electrically connected with a first scanning line and a second scanning line;

the pixel circuit further comprises a first transistor, a second transistor, and a storage capacitor, the first transistor is configured to transmit data voltage signals on the data line to the gate of the driving transistor based on a first scan signal of the first scanning line, and the second transistor is configured to transmit a reference voltage signal on the reference signal line to the second electrode of the driving transistor based on a second scan signal of the second scanning line;

the first subpixel, the second subpixel, the third subpixel, and the fourth subpixel of an identical pixel unit are arranged in a row direction and are electrically connected with a given reference signal line;

wherein a color of the first subpixel, a color of the second subpixel, a color of the third subpixel, and a color of the fourth subpixel differ from one another, the color of the first subpixel, the color of the second subpixel, and the color of the third subpixel are red, blue, and green, respectively, and the color of the fourth subpixel is not white;

a working time of the organic light-emitting display panel comprises a light emitting phase;

in the light emitting phase, the integrated circuit provides the reference voltage signal to the reference data lines, and provides data voltage signals to the data lines, the first transistor transmits the data voltage signals to the gate of the driving transistor based on the first scan signal of the first scanning line, and the second transistor transmits the reference voltage signal to the second electrode of the driving transistor based on the second scan signal of the second scanning line to turn on the driving transistor and enable the organic light-emitting diode to emit light;

wherein the integrated circuit determines a current yellowing degree of light synthesized by the first subpixel, the second subpixel and the third subpixel at a 225-order brightness according to a preset curve of a yellowing degree changing with time;

the integrated circuit compares the current yellowing degree with a preset yellowing degree threshold;

the integrated circuit determines an amplitude adjustment coefficient according to the preset yellowing degree threshold and the current yellowing degree in response to that the current yellowing degree is greater than the preset yellowing degree threshold; and the integrated circuit adjusts the amplitude of the data voltage signal provided to the fourth subpixel according to the amplitude adjustment coefficient.

* * * * *